United States Patent
Naito et al.

(10) Patent No.: US 9,419,152 B2
(45) Date of Patent: Aug. 16, 2016

(54) CARBON ELECTRODE, CARBON ELECTRODE PRODUCTION METHOD, AND PHOTOELECTRIC CONVERSION DEVICE

(71) Applicant: KABUSHIKI KAISHA TOSHIBA, Minato-ku, Tokyo (JP)

(72) Inventors: Katsuyuki Naito, Tokyo (JP); Norihiro Yoshinaga, Kanagawa (JP); Shigeru Matake, Kanagawa (JP); Yoshihiro Akasaka, Kanagawa (JP); Takashi Yoshida, Saitama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 13/771,712

(22) Filed: Feb. 20, 2013

(65) Prior Publication Data
US 2013/0255763 A1 Oct. 3, 2013

(30) Foreign Application Priority Data
Mar. 30, 2012 (JP) .................... 2012-081926

(51) Int. Cl.
| | | |
|---|---|---|
| H01L 31/0224 | (2006.01) | |
| H01L 21/02 | (2006.01) | |
| H01L 31/0749 | (2012.01) | |
| H01L 51/44 | (2006.01) | |
| H01L 31/18 | (2006.01) | |

(52) U.S. Cl.
CPC ........ *H01L 31/022425* (2013.01); *H01L 21/02* (2013.01); *H01L 31/022466* (2013.01); *H01L 31/0749* (2013.01); *H01L 51/442* (2013.01); *Y02E 10/541* (2013.01); *Y02E 10/549* (2013.01)

(58) Field of Classification Search
CPC .................... H01L 31/0224; H01L 31/022416
See application file for complete search history.

(56) References Cited

U.S. PATENT DOCUMENTS

| | | | |
|---|---|---|---|
| 2009/0146111 A1* | 6/2009 | Shin et al. ...................... | 252/510 |
| 2011/0284805 A1* | 11/2011 | Samulski ............... | B82Y 30/00 |
| | | | 252/503 |
| 2012/0098028 A1 | 4/2012 | Naito | |
| 2012/0161192 A1* | 6/2012 | Kim et al. ........................ | 257/99 |
| 2012/0164433 A1* | 6/2012 | Advincula ............. | B82Y 30/00 |
| | | | 428/327 |
| 2012/0241796 A1 | 9/2012 | Naito | |
| 2012/0298974 A1* | 11/2012 | Lee et al. ......................... | 257/40 |
| 2013/0078436 A1 | 3/2013 | Naito et al. | |

(Continued)

FOREIGN PATENT DOCUMENTS

| | | |
|---|---|---|
| JP | 2007-157372 | 6/2007 |
| JP | 2009-070660 | 4/2009 |

(Continued)

OTHER PUBLICATIONS

Pei et al "The Reduction of Graphene Oxide", Nov. 2011, Carbon 50, 2012, pp. 3210-3228.*

(Continued)

*Primary Examiner* — Bethany L Martin
(74) *Attorney, Agent, or Firm* — Amin, Turocy & Watson LLP (57) ABSTRACT

A carbon electrode of an embodiment includes: a graphene having a graphene skeleton, carbon atoms in the graphene skeleton being partially substituted by a nitrogen atom, wherein the graphene contains an oxygen atom, and the carbon electrode is doped with a cation.

16 Claims, 4 Drawing Sheets

(56) References Cited

U.S. PATENT DOCUMENTS

2013/0078449 A1 3/2013 Naito et al.
2013/0081678 A1 4/2013 Naito et al.

FOREIGN PATENT DOCUMENTS

JP 2010-525526 7/2010
WO 2008-131304 10/2008

OTHER PUBLICATIONS

Patra et al Electrospun Polylactic acid based conducting nanofibrous network, Materials Science and Engineering 4, 2009, pp. 1-7.*

Kanematsu et al "Electrochemically Stable Fluorohydrocarbonate Ionic Liquids based on Quaternary Phosphonium Cations", Electrochemistry Communications 11, 2009, pp. 1312-1315.*

Tsunashima et al, Physical and electrochemical properties of room-temperature dicynamide ionic liquids based on quaternary phosphonium cations, 2010, Electrochemica Acta, vol. 56, pp. 762-766.*

Hague et al, Electrochemically reduced graphen oxide-based electrochemical immunosensing platform for ultrasensitive antigen detection, Jan. 2012, Analytical Chemistry, vol. 84 pp. 1871-1878.*

Park et al, Chemical structures of hydrazine-treated graphene oxide and generation of aromatic nitrogen doping, Jul. 2011, Nature Communications, pp. 1-8.*

Paraknowitsch et al, Nitrogen and phosphorus co doped carbons with tunable enhanced surface areas promoted by the doping additives, Dec. 2012, Royal Society of Chemistry Chemical Communications vol. 49 pp. 1208-1210.*

Tsetseris et al , Molecular Doping of Graphene with Ammonium Groups, Apr. 2012, Physical Review, 85, 155446.*

Lee et al, Modification of Electronic Properties of Graphene with Self-Assembled Monolayers, Nano Letters, vol. 10, 2010, pp. 2427-2432.

Choi et al, Chemical Doping of Epitaxial Graphene by Organic Free Radicals, The Journal of Physical Chemistry Letters, vol. 1, 2010, pp. 505-509.

Office Action of Notification of Reason(s) for Refusal for Japanese Patent Application No. 2012-081926 Dated Jul. 22, 2014; 7 pgs.

Hye Ryung Byon et al. "Graphene-Based Non-Noble-Metal Catalysts for Oxygen Reduction Reaction in Acid", Chemistry of Materials, American Chemical Society, Jun. 18, 2011, vol. 23, pp. 3421-3428.

R. Imran Jafri et al. "Nitrogen doped graphene nanoplatelets as catalyst support for oxygen reduction reaction in proton exchange membrane fuel cell", Journal of Materials Chemistry, The Royal Society of Chemistry, Sep. 4, 2010, vol. 20, No. 34, pp. 7114-7117.

Office Action of Notification of Reason(s) for Refusal for Japanese Patent Application No. 2012-081926 Dated Mar. 31, 2015, 4 pages.

John A. Dean. "Lange's Handbook of Chemistry", 11th Edition, McGraw-Hill Book Company, Table 6-2, 1968.

Al-Monsur Jiaul Haque, et al. "An Electrochemically Reduced Graphene Oxide-Based Electrochemical Immunosensing Platform for Ultrasensitive Antigen Detection", Jan. 13, 2012, Analytical Chemistry, 84 (4), pp. 1871-1878.

* cited by examiner

CARBON ELECTRODE, CARBON ELECTRODE PRODUCTION METHOD, AND PHOTOELECTRIC CONVERSION DEVICE

CROSS-REFERENCE TO RELATED APPLICATION

This application is based upon and claims the benefit of priority from Japanese Patent Applications No. 2012-081926, filed on Mar. 30, 2012; the entire contents of which are incorporated herein by reference.

FIELD

Embodiments described herein relate generally to a carbon electrode, a carbon electrode production method, and a photoelectric conversion device.

BACKGROUND

Various developments have been made on conductors containing carbon materials (such as carbon fibers, carbon nanotubes, and graphenes) and electrical devices using the conductors including photoelectric conversion devices (such as solar cells, organic EL devices, optical sensors, and field electron emission devices).

The carbon material can be used to greatly reduce the usage of a rare metal or the like. The carbon material is excellent in flexibility, mechanical strength, and chemical stability. The carbon material has a relatively high conductivity and exhibits a high resistance in intermolecular conduction. A large-area transparent electrode containing the carbon material has a higher electrical resistance as compared with those containing an indium tin oxide (ITO) film having the same light transmittance. In addition, the carbon material exhibits a higher electrical resistance in a long-distance electrical wire or the like as compared with metal conductive materials containing a metal such as copper.

Therefore, composites of the carbon material and a particle or wire of a metal or semiconductor have been studied in view of improving the conductivity.

DETAILED DESCRIPTION

A carbon electrode of an embodiment includes: a graphene having a graphene skeleton, carbon atoms in the graphene skeleton being partially substituted by a nitrogen atom, wherein the graphene contains an oxygen atom, and the carbon electrode is doped with a cation.

A method for producing a carbon electrode of an embodiment includes treating a graphene oxide with hydrazine and electrochemically reducing the hydrazine-treated graphene oxide in a supporting electrolyte solution.

A photoelectric conversion device of an embodiment includes a carbon electrode as a negative electrode, wherein the carbon electrode contains a graphene having a graphene skeleton, carbon atoms in the graphene skeleton being partially substituted by a nitrogen atom, the graphene contains an oxygen atom, and the carbon electrode is doped with a cation.

Embodiments of the invention will be described below with reference to the drawings.

An alloy of Al, Mg, or the like has been used for a negative electrode. However, the alloy is often oxidized by water, oxygen, or the like. Particularly its metal interface is readily oxidized. Thus, in the negative electrode, the charge injection from the interface is significantly deteriorated though the bulk conductivity is maintained.

Therefore, the oxidation is prevented by sealing the negative electrode tightly or by sealing the negative electrode together with a water removing agent, an oxygen removing agent, or the like. However, it is difficult to completely remove water from a photoelectric conversion layer formed by an application process or the like. Thus, the resultant device has a short lifetime, has a complicated costly structure for removing the water and oxygen, and cannot be easily produced as a flexible device.

In a case where a photoelectric conversion device has a negative electrode containing an indium tin oxide (ITO) film and a positive electrode containing a metal with a high work function, a transparent n-type semiconductor layer containing zinc oxide (ZnO) or the like is formed between the ITO film and a photoelectric conversion layer to facilitate charge injection from the negative electrode to the photoelectric conversion layer. However, in this case, the photoelectric conversion device is disadvantageous in increased resistance, lowered efficiency, instability of the ZnO layer, and the like. In addition, also the ITO film has a limited chemical stability, and is brittle and inflexible in the form of the film.

In a case where a stable, flexible, transparent electrode containing a carbon nanotube or thin planar graphene film having an unsubstituted graphene structure is used as a transparent positive electrode instead of the ITO film, a negative electrode containing a metal with a low work function is used. Therefore, also in this case, the resultant device has to be tightly sealed. Thus, the inexpensive and flexible properties of the thin graphene film cannot be sufficiently utilized.

In view of solving the problems of the related art, according to an embodiment, there are provided a carbon electrode, which has a high stability and a low work function to be suitable as a negative electrode, and a method for producing the same.

Figure 1:
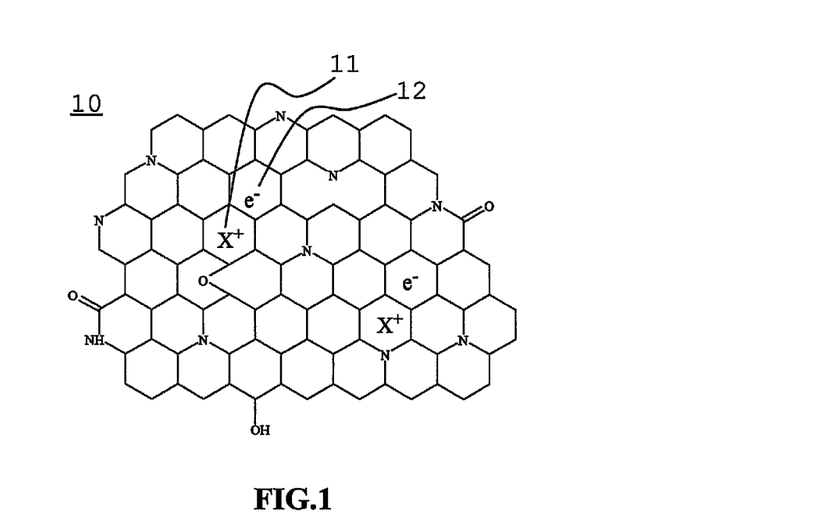
FIG. 1 is a conceptual view of a molecular structure example of a carbon electrode according to an embodiment.

FIG. 1 is a conceptual view of a molecular structure example of a graphene skeleton in a carbon electrode 10 according to the embodiment. In this structure, nitrogen and oxygen atoms are introduced into a part of a planar single-layer graphene. The carbon electrode 10 is doped with cations ($X^+$) 11, and the graphene skeleton is doped with electrons ($e^-$) 12. The carbon electrode of the embodiment is a single-layer graphene of the embodiment or a graphene stack containing the single-layer graphene.

Figure 2:
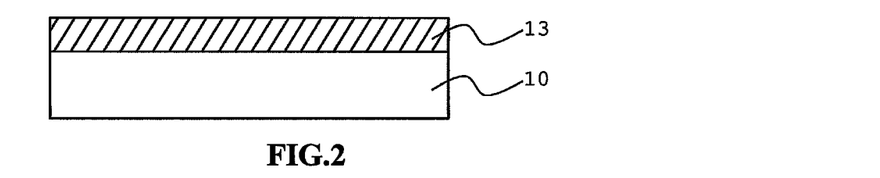
FIG. 2 is a conceptual view of the carbon electrode of the embodiment used in a stack.

FIG. 2 is a conceptual view of the carbon electrode 10 stacked with a metal nanowire layer 13.

In the carbon electrode of the embodiment, the graphene preferably has a planar structure. Such a planar structure can be more easily connected to a metal material and can have a lower work function as compared with a curvature structure such as a carbon nanotube. The carbon electrode of the embodiment may contain a mixture or a stack of a planar graphene and a curved graphene.

As the number of graphene layers increases in the carbon electrode, the light transmittance decreases though the conductivity increases. Therefore, when the carbon electrode is used as a transparent electrode, the number of the graphene layers is preferably 15 or less, more preferably 1 to 5. When the carbon electrode is used as a conductive material that is not required to be transparent, the number of the graphene layers may be not within this range, and the thickness of the graphene layers may be for example 100 nm or less. Even in the case of the conductive material that is not required to be transparent, the thickness is preferably 10 to 50 nm in view of connection to the metal material.

The carbon atoms in the graphene skeleton of the planar single-layer graphene are partially substituted by the nitrogen atoms. The nitrogen atom substituents may be in the form of a quaternary nitrogen, a pyridine nitrogen, a pyrrole/pyridone nitrogen, or a nitrogen bonded to an oxygen.

The ratio of the nitrogen atom substituents to the carbon atoms in the graphene skeleton is preferably 0.1 to 30 atom %. When the ratio is less than the lower limit, it is difficult to obtain a sufficiently low work function. On the other hand, when the ratio is more than the upper limit, the graphene structure is deteriorated to lower the conductivity disadvantageously.

As described above, in the carbon electrode of the embodiment, the carbon atoms in the graphene are partially substituted by the nitrogen atoms. The structure containing the nitrogen-substituted graphene has an n-type semiconductor property and exhibits a work function lower than that of an unsubstituted graphene free from heteroatoms such as the nitrogen atoms. When a tetravalent carbon atom is substituted by a pentavalent nitrogen atom, the nitrogen atom has a positive charge and releases an electron into the graphene skeleton, whereby the work function is changed.

The carbon atoms in the graphene skeleton of the planar single-layer graphene are partially bonded to the oxygen atoms. The oxygen atoms in the graphene skeleton can act to reduce the long-term degradation effect of an oxygen molecule or the like. The oxygen atoms may be bonded to the carbon atoms in the form of an ether oxygen, a ketone oxygen, an alcohol oxygen, a phenol oxygen, a carboxylic acid oxygen, or the like.

The single-layer graphene and the graphene stack containing the single-layer graphene preferably have such an oxygen concentration that the ratio of the oxygen atoms to the carbon atoms is 5 to 12 atom %. The oxygen atoms can be easily chemical-bonded to the carbon atoms, and a property of the electrode is changed due to the oxygen atoms in a long period. When the ratio of the oxygen atoms to the carbon atoms is 5% or more, the electrode has an excellent long-term stability. Furthermore, the surface hydrophobicity of the electrode is lowered by the oxygen atoms, so that the electrode becomes more wettable with a solvent in a polar electrolyte and can be more easily doped with the electrolyte. However, when the ratio of the oxygen atoms to the carbon atoms is more than 12%, it is difficult to obtain a sufficiently low work function because of the oxygen atoms. Furthermore, the oxygen atoms act as an electron trapping site to increase the electrical resistance disadvantageously.

As shown in FIG. 1, in addition to the nitrogen atom substitution and the oxygen atom introduction, the doping with the cations ($X^+$) 11 is performed in the carbon electrode. Furthermore, the graphene skeleton is doped with the electrons ($e^-$) 12 as a counter charge for the cations ($X^+$) 11.

When the carbon electrode is doped with the cations ($X^+$) 11, it is doped also with the counter charge electrons ($e^-$) 12. The electrons ($e^-$) 12 act to further lower the work function of the carbon electrode.

In a case where a large amount of the carbon electrode is obtained, the ratio of the oxygen or nitrogen atoms to the carbon atoms can be measured by an elemental analysis utilizing combustion in a CHN analyzer or the like. For example, in this measurement, the carbon electrode may be peeled and isolated from a photoelectric conversion device or the like.

In a case where the amount of the carbon electrode is too small as the analysis subject to perform the elemental analysis, the ratio can be measured by an XPS (X-ray photoelectron spectroscopy). Though measurement apparatuses vary in signal sensibility, the signal strength of each element can be corrected by using a reference material having a known composition. For example, a carbon nitride having a composition of $C_3N_4$ may be used as a C/N standard substance. In the XPS, a peak position is often shifted depending on a measurement condition. A large shift amount may be calibrated by using a peak of gold (Au) or the like as a standard.

In the carbon electrode of the embodiment, the doped cation is preferably a quaternary ammonium ion or a quaternary phosphonium ion. The quaternary ammonium and phosphonium ions can have a large stereostructure and can be stably present in the carbon electrode. However, when the cation has an excessively large structure, the cation may be poor in solubility in a solution and may be difficult to be introduced into the carbon electrode. The doped cation is further preferably a quaternary ammonium or phosphonium ion having four alkyl chains each containing 2 to 6 carbon atoms. The four alkyl chains may be the same or different chains. The quaternary ammonium or phosphonium ion may be in a form of an oligomer or a polymer.

Figure 3:
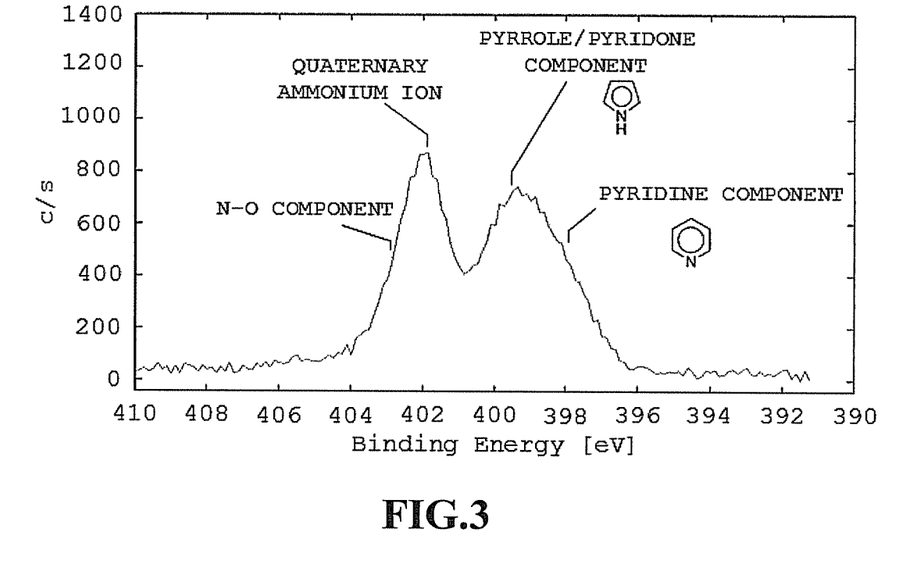
FIG. 3 is an XPS measurement result example of the carbon electrode of the embodiment.

It is preferred that the carbon electrode of the embodiment is doped with the quaternary ammonium cation to exhibit a peak at 402.0±0.4 eV corresponding to the photoelectron kinetic energy of a nitrogen 1 s orbital in the X-ray photoelectron spectrum of FIG. 3 in the XPS. The quaternary ammonium ion can be stably present in the carbon electrode because a high energy is required to release an electron from the nitrogen ion. This peak corresponds to the nitrogen atom in the quaternary ammonium ion and is positioned on the higher-energy side of a nitrogen 1 s peak at 401.2 eV of a quaternary nitrogen in the graphene in the XPS. Furthermore, the peak of the nitrogen atom in the doped quaternary ammonium ion is different from the nitrogen 1 s orbital peaks of the other nitrogen atoms in the graphene skeleton in the XPS. The peaks of the other nitrogen atoms include a peak of an N—O nitrogen at 402.8 eV, a peak of a pyrrole/pyridone nitrogen at 398.6 eV, and a peak of a pyridine nitrogen at 397.8 eV.

For example, the XPS may be carried out using PHI Quantum-2000 with an X-ray source of a single-crystal AlKα emission line and charge neutralizer $Ar^+$ and $e^-$ guns under conditions of an output of 40 W, an analysis area diameter of 200 μm, pass energies of 187.85 eV (1.60 eV/step) for wide scan and 58.70 eV (0.125 eV/step) for narrow scan, and a geometry θ of 45° (in which θ is an angle between a sample surface and a detector). The measurement sample may be connected with a conductive tape or the like to prevent charge up if necessary.

Figure 4:
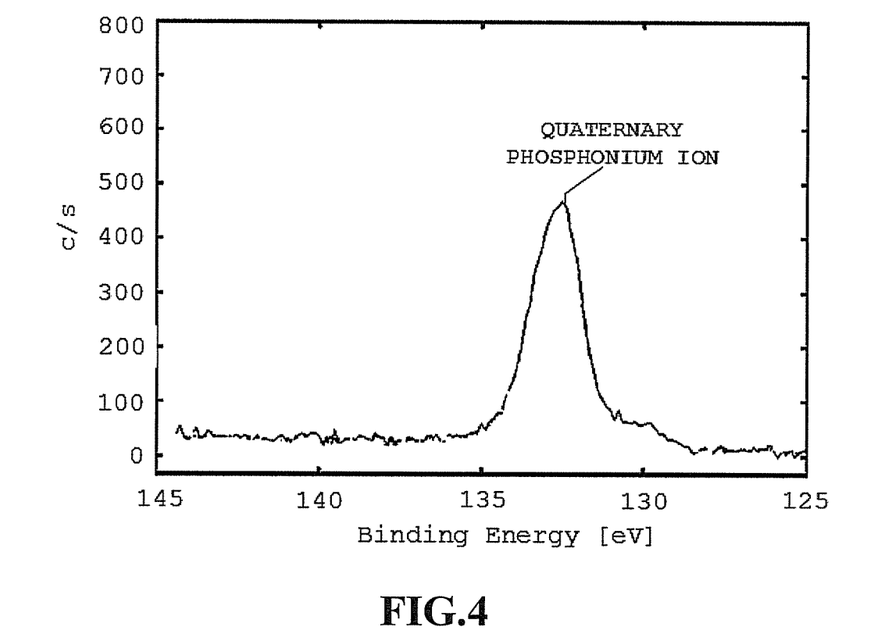
FIG. 4 is another XPS measurement result example of the carbon electrode of the embodiment.

It is preferred that the carbon electrode of the embodiment is doped with the quaternary phosphonium cation to exhibit a peak at 132.5±0.4 eV corresponding to the photoelectron kinetic energy of a phosphorus 2 p orbital in the X-ray photoelectron spectrum of FIG. 4 in the XPS. The quaternary phosphonium ion can be stably present in the carbon electrode because a high energy is required to release an electron from the phosphorus ion. This peak corresponds to the phosphorus atom in the quaternary phosphonium ion and is positioned on the higher-energy side of a peak of an easily oxidizable phosphorus solid at 130.1 eV and a peak of triphenylphosphine at 130.9 eV.

It is preferred that the carbon electrode of the embodiment is stacked with the metal nanowire layer to improve the conductivity of the electrode. Though the graphene domain has a high conductivity, the graphene domain boundary has a relatively high resistance between the graphene domains. Therefore, the metal nanowire layer may be stacked thereon to improve the conductivity. When the carbon atoms in the graphene skeleton are partially substituted by the nitrogen atoms, the nitrogen atom can be coordinated with such a metal material to strengthen the connection between the carbon electrode and the metal material. Furthermore, the electron transfer can be facilitated to lower the interface electrical resistance between the carbon material and the metal material. In addition, the easily oxidizable metal material can be protected by the nitrogen substitution. A very thin metal film may be inserted between the graphene layer and the metal nanowire layer to improve the conductivity and adhesion. The thickness of the film is less than 10 nm, and preferably less than 5 nm to get a good transmittance. A transparent materials such as ITO nanoparticle or conducting polymer may be included in the metal nanowire layer to improve the conductivity.

The metal nanowire in the metal nanowire layer preferably has a diameter of 30 to 150 nm. When the metal nanowire has a size suitable for the carbon material, the materials can be easily combined and connected. The metal nanowire preferably has an average length of 1 to 40 µm. When the length is less than 1 µm, the nanowires are less tangled, resulting in an increased resistance. On the other hand, when the length is more than 40 µm, the nanowires are unstably dispersed in a solvent. The metal nanowire more preferably has an average length of 5 to 30 µm.

The metal nanowire preferably contains silver, which has high conductivity and stability, is dispersible in water, and has a great plasmon effect. It is more preferred that the silver is alloyed with a small amount of palladium to further improve the resistance of the metal nanowire against a sulfur substance or the like in air. Gold is the most stable substance and is suitable for a conductive material required to be highly reliable in a semiconductor device or the like. Copper has a high conductivity and is more inexpensive than silver, and thereby is suitable for an electrical wire material, a wiring material, or the like. A high-melting-point tungsten nanowire is suitable for a conductive material exposed to a high temperature or a high voltage. A molybdenum nanowire is suitable for an electrode for a solar cell using a CIGS (Cu(In,Ga)Se) in a photoelectric conversion layer.

The number of the planar graphene layers can be measured by cross-section observation using a TEM (transmission Electron Microscope)

When the carbon electrode is used as a negative electrode, for example, an energy barrier between the negative electrode and an n-type semiconductor layer in a photoelectric conversion layer can be lowered to improve the electron transfer efficiency. When the carbon electrode is used as a field electron emission source, electrons can be released under a low threshold voltage.

A method for producing a carbon electrode according to an embodiment will be described below.

The carbon electrode production method of this embodiment contains treating a graphene oxide with hydrazine and electrochemically reducing the hydrazine-treated graphene oxide in a supporting electrolyte solution.

The graphene oxide may be prepared by oxidizing a crystalline graphite having a graphene stack structure or the like with an oxidant such as potassium permanganate in an aqueous mixed sulfuric acid/nitric acid solution.

The graphene oxide can be obtained in a form of a thin graphene oxide film by a so-called dip-coating method containing placing a hydrophilic-treated supporting electrode, glass substrate, or the like in a dispersion liquid of a graphene oxide powder, pulling it out of the dispersion liquid, and drying the resultant, or by a method containing dropping or applying (using a spin coater or the like) a dispersion liquid of a graphene oxide powder onto a hydrophilic-treated supporting electrode, glass substrate, or the like, and then drying the resultant.

For example, in the hydrazine treatment, a hydrazine vapor may be brought into contact with the graphene oxide. Alternatively, an aqueous hydrazine solution may be applied or dispersed onto the graphene oxide, and then the graphene oxide and the hydrazine may be heated in the contact state. It is preferred that the hydrazine is continuously supplied to the graphene oxide to accelerate the nitrogen substitution under heating. When the graphene oxide is in the form of the thin film, the graphene oxide is preferably treated with the hydrazine vapor to maintain the film shape. When the graphene oxide is in the form of a powder, it may be treated with the hydrazine vapor or the aqueous hydrazine solution.

In a case where the supporting electrolyte solution contains the quaternary ammonium or phosphonium ion, by electrochemically reducing the hydrazine-treated graphene oxide in the solution, the oxygen content of the graphene oxide is lowered in the reduction, and the graphene is doped with the electron and the counter quaternary ammonium or phosphonium cation, whereby the carbon electrode with a low work function is produced. The supporting electrolyte is most preferably a quaternary ammonium salt or a quaternary phosphonium salt . The supporting electrolyte may be an alkali metal salt or an alkaline-earth metal salt.

The electrochemical reduction is carried out in the supporting electrolyte solution in water or an organic solvent such as acetonitrile or propylene carbonate. In the electrochemical reduction, a negative potential is applied to the hydrazine-treated graphene oxide on a working electrode by using a reference electrode such as a silver/silver chloride electrode and a counter electrode such as a platinum or carbon electrode. In the solution, a reducing agent such as a brohydride, an aluminumhydride, an Fe(II) salt, a Sn(II) salt, and an aminoboran may be added to reduce or omit the potential. Ionic reducing agents can act as a supporting electrolyte.

The supporting electrolyte concentration of the supporting electrolyte solution is, for example, 0.05 to 0.1 mol/l. When the reference electrode is a silver/silver chloride electrode, the negative potential is preferably −1.8 to −1.0 V. The working electrode is preferably an electrode having a wide potential window such as a carbon electrode, a diamond electrode, or a metal electrode. The working electrode preferably has a low work function to accelerate the reduction of the hydrazine-treated graphene oxide.

The negative potential to be applied to the working electrode may be selected depending on the material of the working electrode. When the working electrode is a carbon electrode or a silver electrode, the negative potential is −1.6 to −1.0 V, more preferably −1.6 to −1.3 V. When the working electrode is a diamond electrode, the negative potential is −1.8 to −1.0 V, more preferably −1.8 to −1.3 V. The carbon electrode and the silver electrode are particularly preferred because they have a relatively low work function and a high chemical stability.

A method for producing a carbon electrode stacked with a metal nanowire according to an embodiment will be described below.

For example, in the carbon electrode production method of the embodiment, a hydrazine-treated graphene oxide may be electrochemically reduced on a conductive film containing the metal nanowire. Alternatively, the hydrazine-treated graphene oxide may be electrochemically reduced, and then the conductive film containing the metal nanowire may be formed on the graphene. In the conductive film, the metal nanowires are randomly oriented.

The conductive film containing the metal nanowire may be formed by applying a solution containing the metal nanowire to a working electrode or the graphene oxide. The conductive film containing the metal nanowire may be formed without applying the metal nanowire, to the working electrode. In a case where the conductive film is formed by applying the solution containing the metal nanowire to the working electrode, the graphene oxide may be formed, hydrazine-treated, and reduced on the conductive film. When the conductive film containing the metal nanowire layer is used as the working electrode, a negative potential can be easily applied to the hydrazine-treated graphene oxide, and the transparent electrode can be produced without a step of peeling from the working electrode.

The conductive film containing the metal nanowire has a high transparency and can be stacked with the carbon electrode of the embodiment to obtain an electrode with a low electrical resistance. Though also the hydrazine-treated graphene oxide has a high transparency, the graphene oxide has a relatively high electrical resistance, which is unsatisfactory for use as a transparent electrode.

The metal nanowire of the embodiment is prepared by reducing an aqueous solution containing a metal ion with a reductant. The shape and size of the metal nanowire can be controlled by selecting the reductant, a protective polymer, and a coexisting ion. Particularly in the case of preparing a silver nanowire, a polyalcohol such as ethylene glycol is preferably used as the reductant. Since the metal nanowire is readily oxidized, the metal nanowire is preferably covered with the protective polymer. The protective polymer may be a polyvinyl pyrrolidone, a polymethyl methacrylate, or the like. The metal nanowire may be covered with the protective polymer by dissolving the protective polymer in ethyl acetate, applying the solution to the metal nanowire conductive film, and drying the applied solution.

The very thin metal film may be inserted between the graphene layer and the metal nanowire layer. The metal film is prepared by vacuum deposition of metal or by casting metal nanoparticles or precursor compounds of the metal.

Figure 5:
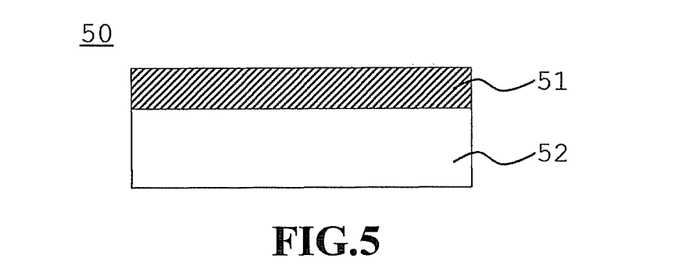
FIG. 5 is a conceptual view of a photoelectric conversion device according to an embodiment.

A photoelectric conversion device 50 according to an embodiment will be described below. As shown in FIG. 5, the photoelectric conversion device 50 contains at least a negative electrode 51 and a photoelectric conversion layer 52. The negative electrode 51 is a carbon electrode containing a graphene having a graphene skeleton, and carbon atoms in the skeleton are partially substituted by a nitrogen atom. The graphene contains an oxygen atom, and the carbon electrode is doped with a cation. The negative electrode 51 is not necessarily in contact with the photoelectric conversion layer 52.

A solar cell according to an embodiment, which is a photoelectric conversion device using the carbon electrode of the above embodiment as a transparent negative electrode, will be described below.

Figure 6:
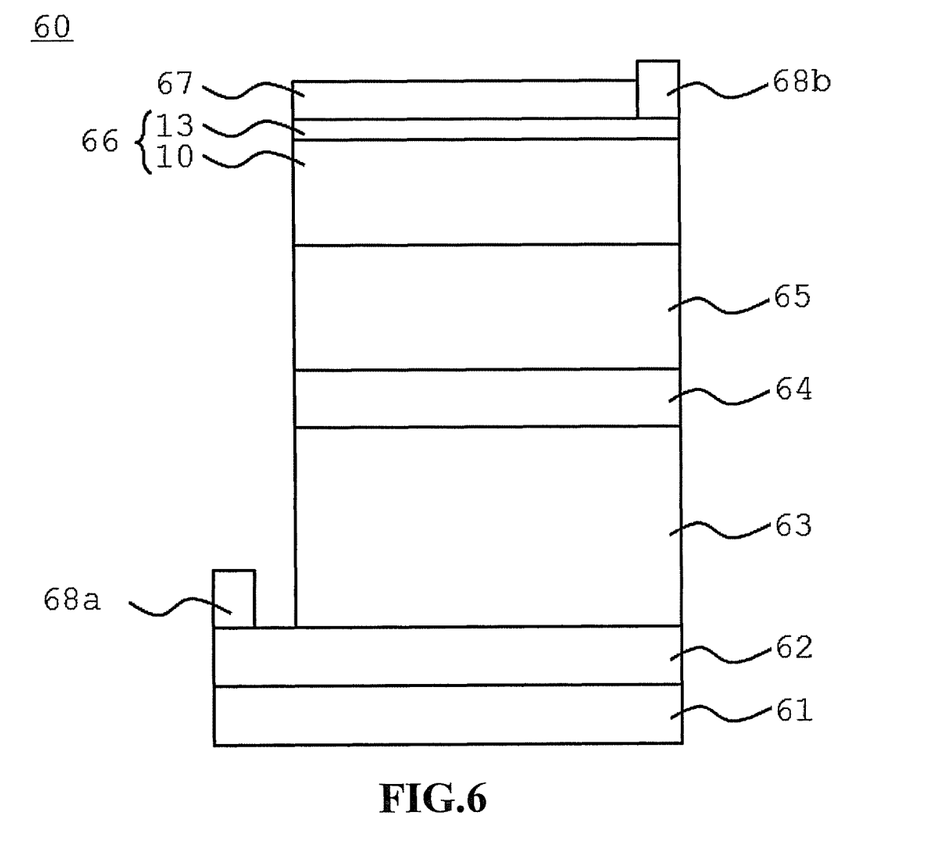
FIG. 6 is a conceptual view of a compound thin-film solar cell as a photoelectric conversion device according to an embodiment.

FIG. 6 is a conceptual cross-sectional view of an example of a compound thin-film solar cell 60. The compound thin-film solar cell 60 contains a substrate 61, a back electrode 62 disposed on the substrate 61, a p-type layer 63 disposed on the back electrode 62, an n-type layer 64 disposed on the p-type layer 63, a semi-insulating layer 65 disposed on the n-type layer 64, a transparent electrode layer 66 disposed on the semi-insulating layer 65, an antireflection film 67 disposed on the transparent electrode layer 66, a lead-out electrode 68a disposed on the back electrode 62, and a lead-out electrode 68b disposed on the transparent electrode layer 66.

The substrate 61 is preferably a float glass plate, and may be a plate containing a metal such as a stainless steel, Ti, or Cr or a resin such as a polyimide.

The back electrode 62 may be a film of a metal such as Mo or W, and is preferably a Mo film.

The p-type layer 63 may be a thin semiconductor film having a chalcopyrite-type crystalline structure containing Cu, an element A (in which A is at least one element selected from the group including Al, In, and Ga), and Te. The Te atoms may be partially substituted by an O atom.

The n-type layer 64 may contain a compound capable of forming a p-n junction interface in combination with the p-type light absorbing layer 63. Specifically, the n-type layer 64 may contain a compound having a zinc blende-type, wurtzite-type, or defect spinel-type crystalline structure containing at least one element selected from the group including Cd, Zn, In, and Ga and at least one element selected from the group including S, Se, and Te.

The semi-insulating layer 65 may be an $n^+$-type layer containing ZnO or the like.

The transparent electrode layer 66 contains the carbon electrode 10 of the embodiment and the metal nanowire layer 13 stacked thereon.

The antireflection film 67 is preferably formed to efficiently introducing a solar light. The antireflection film 67 may contain $MgF_2$.

The lead-out electrodes 68a and 68b may contain Al, Ag, or Au. The lead-out electrode 68b may be formed by depositing Ni or Cr on the transparent electrode layer 66 and then depositing Al, Ag, or Au thereon, to improve the adhesion between the lead-out electrode 68b and the transparent electrode layer 66.

The compound thin-film solar cell 60 has an improved conversion efficiency due to the carbon electrode 10 of the embodiment having excellent transmittance and conductivity.

The compound thin-film solar cell 60 is an example of practical use of the carbon electrode. The carbon electrode can be suitably used as a transmissive or conductive electrode for a dye-sensitized solar cell, an organic thin-film solar cell, an electronic paper, or the like.

Figure 7:
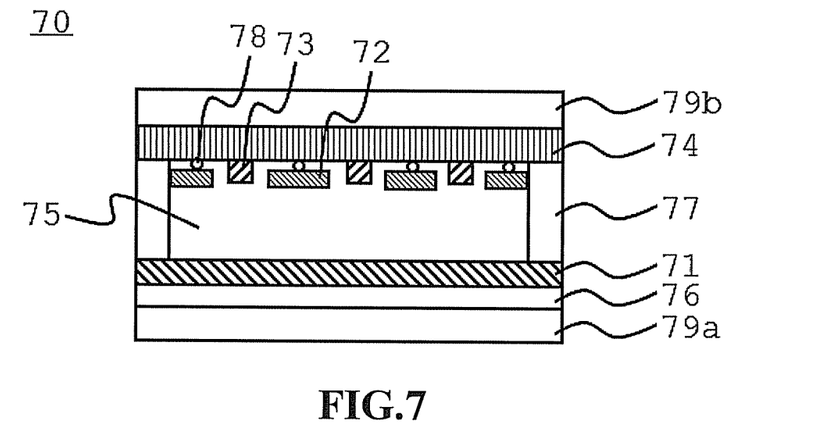
FIG. 7 is a conceptual view of a light emitting device using a photoelectric conversion device according to an embodiment as a field electron emission source.

FIG. 7 is a conceptual view of an example of a light emitting device 70 using a photoelectric conversion device as a field electron emission source. The light emitting device 70 contains a fluorescent film 71 capable of emitting a light under an electron beam irradiation, a gate electrode 72, a negative electrode 73 of a carbon electrode, an electrode 74 connected to the carbon electrode, a vacuum space 75, a positive electrode 76, sealants 77, spacers 78, and substrates 79a and 79b. When a voltage is applied between the positive and negative electrodes, electrons are released from the carbon electrode having a low work function and introduced to the fluorescent film, so that the light emitting device 70 emits a light.

Figure 8:
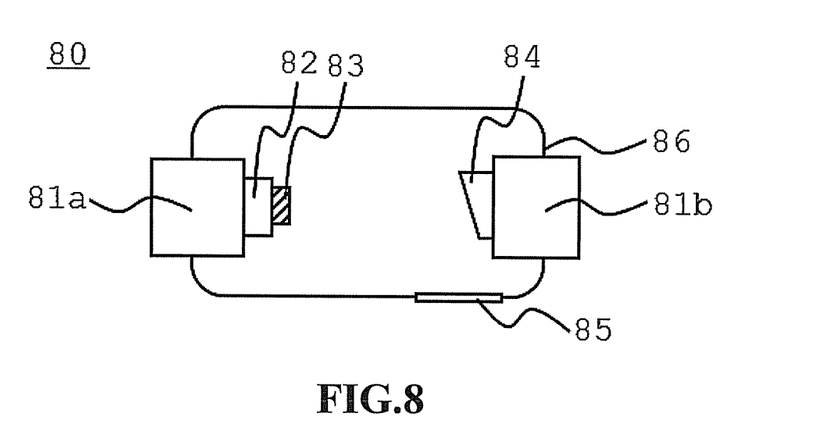
FIG. 8 is a conceptual view of an X-ray generating device using a photoelectric conversion device according to an embodiment as a field electron emission source.

FIG. 8 is a conceptual view of an example of an X-ray generating device 80 using a photoelectric conversion device as a field electron emission source. The X-ray generating device 80 contains a negative, electrode mount 81a, an electrode 82 (which preferably includes or contains a gas-adsorbable metal such as titanium, palladium, or zirconia), a negative electrode 83 of a carbon electrode, a positive electrode 84 (which preferably contains a metal capable of generating an X-ray under an electron beam irradiation such as molybdenum, rhodium, tungsten, silver, gold, or copper), a positive electrode mount 81b, a X-ray outlet window 85, and a vacuum vessel 86.

Several specific Examples will be described below.

Example 1

A graphene oxide is synthesized in accordance with a literature (W. S. Hummers, et al., J. Am. Chem. Soc., 1958, vol. 80, page 149) using a graphite having an average particle diameter of approximately 4 μm (manufactured by Ito Graphite Co., Ltd.) as a starting material. A dispersion liquid of a silver nanowire having an average diameter of 111 nm (manufactured by Seashell Technology) is dropped and dried on a thin gold film electrode, and then an ammonia-containing water dispersion liquid of the graphene oxide is dropped and dried thereon. The graphene oxide is reacted with a hydrated hydrazine vapor at 80° C. for 1 hour in a hydrazine treatment. A negative potential of −1.25 V is applied to the hydrazine-treated graphene oxide in a mixed acetonitrile/water solvent using a supporting electrolyte of tetra-n-butylammonium bromide, a counter carbon electrode, and a reference silver/silver chloride electrode. The resultant is washed with a pure water and dried to obtain a carbon electrode.

The obtained carbon electrode is analyzed by an XPS. As a result, the ratio of the nitrogen atoms to the carbon atoms is 6 atom %, and the ratio of the oxygen atoms to the carbon atoms is 10 atom %. The nitrogen atoms include 27% of quaternary nitrogen atoms, 18% of pyridine nitrogen atoms, 38% of pyrrole/pyridone nitrogen atoms, and 18% of N—O nitrogen atoms. As shown in FIG. 3, the carbon electrode has a peak wavelength of a nitrogen 1 s orbital at 402.0±0.2 eV. The carbon electrode has a remarkably low work function of 3.5±0.1 eV measured by a UPS and therefore is excellent as a negative electrode.

Example 2

A graphene oxide is synthesized in accordance with a literature (W. S. Hummers, et al., J. Am. Chem. Soc., 1958, vol. 80, page 149) using a graphite having an average particle diameter of approximately 4 μm (manufactured by Ito Graphite Co., Ltd.) as a starting material. An ammonia-containing water dispersion liquid of the graphene oxide is dropped and dried on a carbon electrode. The graphene oxide is reacted with a hydrated hydrazine vapor at 80° C. for 1 hour in a hydrazine treatment. A negative potential of −1.6 V is applied to the hydrazine-treated graphene oxide in a mixed acetonitrile/water solvent using a supporting electrolyte of tetra-n-butylammonium bromide, a counter carbon electrode, and a reference silver/silver chloride electrode. The resultant is washed with a pure water, the above carbon electrode is peeled and removed in water, and the residue is dried to obtain a carbon electrode.

The obtained carbon electrode is analyzed by an XPS. As a result, the ratio of the nitrogen atoms to the carbon atoms is 6 atom %, and the ratio of the oxygen atoms to the carbon atoms is 6 atom %. The nitrogen atoms include 43% of quaternary nitrogen atoms, 12% of pyridine nitrogen atoms, 29% of pyrrole/pyridone nitrogen atoms, and 16% of N-O nitrogen atoms.

The carbon electrode has a peak wavelength of a nitrogen 1 s orbital at 401.8±0.2 eV. The carbon electrode has a remarkably low work function of 3.0 ±0.1 eV measured by a UPS and therefore is excellent as a negative electrode.

Example 3

A graphene oxide is synthesized in accordance with a literature (W. S. Hummers, et al., J. Am. Chem. Soc., 1958, vol. 80, page 149) using a graphite having an average particle diameter of approximately 4 μm (manufactured by Ito Graphite Co., Ltd.) as a starting material. An ammonia-containing water dispersion liquid of the graphene oxide is dropped and dried on a carbon electrode. The graphene oxide is reacted with a hydrated hydrazine vapor at 80° C. for 1 hour in a hydrazine treatment. A negative potential of −1.6 V is applied to the hydrazine-treated graphene oxide in a mixed acetonitrile/water solvent using a supporting electrolyte of tetra-n-butylphosphonium bromide, a counter carbon electrode, and a reference silver/silver chloride electrode. The resultant is washed with a pure water, the above carbon electrode is peeled and removed in water, and the residue is dried to obtain a carbon electrode.

The obtained carbon electrode is analyzed by an XPS. As a result, the ratio of the nitrogen atoms to the carbon atoms is 5 atom %, the ratio of the oxygen atoms to the carbon atoms is 11 atom %, and the ratio of the phosphorus atoms is 1.5 atom %. The nitrogen atoms include 14% of quaternary nitrogen atoms, 23% of pyridine nitrogen atoms, 54% of pyrrole/pyridone nitrogen atoms, and 8% of N—O nitrogen atoms.

The carbon electrode has a peak wavelength of a phosphorus 2 p orbital at 132.5±0.2 eV. The carbon electrode has a low work function of 3.8±0.1 eV measured by a UPS and therefore is excellent as a negative electrode.

Example 4

A graphene oxide is synthesized in accordance with a literature (W. S. Hummers, et al., J. Am. Chem. Soc., 1958, vol. 80, page 149) using a graphite having an average particle diameter of approximately 4 μm (manufactured by Ito Graphite Co., Ltd.) as a starting material. An ammonia-containing water dispersion liquid of the graphene oxide is dropped and dried on a carbon electrode. The graphene oxide is reacted with a hydrated hydrazine vapor at 80° C. for 1 hour in a hydrazine treatment. A negative potential of −1.6 V is applied to the hydrazine-treated graphene oxide in a mixed acetonitrile/water solvent using a supporting electrolyte of tetra-n-butylphosphonium bromide, a counter carbon electrode, and a reference silver/silver chloride electrode. The resultant is washed with a pure water, the above carbon electrode is peeled and removed in water, and the residue is dried to obtain a carbon electrode.

The obtained carbon electrode is analyzed by an XPS. As a result, the ratio of the nitrogen atoms to the carbon atoms is 5 atom %, the ratio of the oxygen atoms to the carbon atoms is a slightly high value of 14 atom %, and the ratio of the phosphorus atoms is a slightly low value of 1.0 atom %. The nitrogen atoms include 13% of quaternary nitrogen atoms, 20% of pyridine nitrogen atoms, 59% of pyrrole/pyridone nitrogen atoms, and 8% of N—O nitrogen atoms.

The carbon electrode has a peak wavelength of a phosphorus 2 p orbital at 132.7±0.2 eV. The carbon electrode has a low work function of 4.3±0.1 eV measured by a UPS and therefore is usable as a negative electrode.

Example 5

A graphene oxide is synthesized in accordance with a literature (W. S. Hummers, et al., J. Am. Chem. Soc., 1958, vol. 80, page 149) using a graphite having an average particle diameter of approximately 4 μm (manufactured by Ito Graphite Co., Ltd.) as a starting material. A thin graphene oxide film is prepared by a dip-coating method using a hydrophilic glass substrate in a water dispersion liquid of the graphene oxide. The graphene oxide is reacted with a hydrated hydrazine vapor at 80° C. for 1 hour in a hydrazine treatment. The hydrazine-treated graphene oxide is coated with a dispersion liquid of a silver nanowire having an average diameter of 111 nm (manufactured by Seashell Technology) and then dried in an argon flow at 60° C. for 1 hour. The silver nanowire is further coated with an ethyl acetate solution of a polymethyl methacrylate (PMMA). The resultant is dried under vacuum at the room temperature, the above glass substrate is peeled and removed in water, and the residue is dried to obtain a transparent conductive film.

Then, a negative potential of −1.5 V is applied to the transparent conductive film in a mixed acetonitrile/water solvent using a supporting electrolyte of tetra-n-butylphosphonium bromide, a counter carbon electrode, and a reference silver/silver chloride electrode. The resultant is washed with a pure water and dried to obtain a transparent carbon electrode.

The obtained carbon electrode is analyzed by an XPS. As a result, the ratio of the nitrogen atoms to the carbon atoms is 3 atom %, the ratio of the oxygen atoms to the carbon atoms is a high value of 17 atom %, and the ratio of the phosphorus atoms is a slightly low value of 1 atom %. The nitrogen atoms include 8% of quaternary nitrogen atoms, 26% of pyridine nitrogen atoms, 65% of pyrrole/pyridone nitrogen atoms, and 2% of N—O nitrogen atoms.

The carbon electrode has a peak wavelength of a phosphorus 2p orbital at 132.3±0.2 eV. The carbon electrode has a low work function of 3.8±0.1 eV measured by a UPS and therefore is excellent as a negative electrode.

Comparative Example 1

A carbon electrode is produced in the same manner as Example 5 except that the electrochemical reduction is not carried out.

A graphene oxide is synthesized in accordance with a literature (W. S. Hummers, et al., J. m. Chem. Soc., 1958, vol. 80, page 149) using a graphite having an average particle diameter of approximately 4 μm (manufactured by Ito Graphite Co., Ltd.) as a starting material. A thin graphene oxide film is prepared by a pulling method using a hydrophilic glass substrate in an ammonia-containing water dispersion liquid of the graphene oxides The graphene oxide is reacted with a hydrated hydrazine vapor at 80° C. for 1 hour in a hydrazine treatment. The hydrazine-treated graphene oxide is coated with a dispersion liquid of a silver nanowire having an average diameter of 111 nm (manufactured by Seashell Technology) and then dried in an argon flow at 60° C. for 1 hour. The silver nanowire is further coated with an ethyl acetate solution of a polymethyl methacrylate. The resultant is dried under vacuum at the room temperature, the above glass substrate is peeled and removed in water, and the residue is dried to obtain a transparent conductive film.

Then, the transparent conductive film is immersed in a mixed acetonitrile/water solvent containing a supporting electrolyte of tetra-n-butylphosphonium bromide. The resultant is washed with a pure water and dried to obtain a transparent carbon electrode.

The obtained carbon electrode is analyzed by an XPS. As a result, the ratio of the nitrogen atoms to the carbon atoms is 6 atom %, the ratio of the oxygen atoms to the carbon atoms is a remarkably high value of 22 atom %, and the ratio of the phosphorus atoms is a significantly low value of 0.1 atom %.

This means that the carbon electrode is hardly doped with the cation. The nitrogen atoms include 20% of quaternary nitrogen atoms, 9% of pyridine nitrogen atoms, 62% of pyrrole/pyridone nitrogen atoms, and 9% of N—O nitrogen atoms.

The carbon electrode does not have a clear peak wavelength of a phosphorus 2 p orbital. The carbon electrode has a high work function of 4.4±0.1 eV measured by a UPS and therefore is unsuitable as a negative electrode.

Example 6

A graphene oxide is synthesized in accordance with a literature (W. S. Hummers, et al., J. Am. Chem. Soc., 1958, vol. 80, page 149) using a graphite having an average particle diameter of approximately 4 μm (manufactured by Ito Graphite Co., Ltd.) as a starting material. A thin graphene oxide film is prepared by a dip-coating method using a hydrophilic glass substrate in a water dispersion liquid of the graphene oxide. The graphene oxide is reacted with a hydrated hydrazine vapor at 80° C. for 1 hour in a hydrazine treatment. The hydrazine-treated graphene oxide is coated with a dispersion liquid of a silver nanowire having an average diameter of 111 nm (manufactured by Seashell Technology) and then dried in an argon flow at 60° C. for 1 hour. The silver nanowire is further coated with an ethyl acetate solution of a polymethyl methacrylate. The resultant is dried under vacuum at the room temperature, the above glass substrate is peeled and removed in water, and the residue is dried to obtain a transparent conductive film.

Then, a negative potential of −1.5 V is applied to the transparent conductive film in a mixed acetonitrile/water solvent using a supporting electrolyte of tetra-n-butylammonium bromide, a counter carbon electrode, and a reference silver/silver chloride electrode. The resultant is washed with a pure water and dried to obtain a transparent carbon electrode.

The obtained carbon electrode has a low work function of 4.0±0.1 eV measured by a UPS and therefore is excellent as a negative electrode.

Example 7

A graphene oxide is synthesized in accordance with a literature (W. S. Hummers, et al., J. Am. Chem. Soc., 1958, vol. 80, page 149) using a graphite having an average particle diameter of approximately 4 μm (manufactured by Ito Graphite Co., Ltd.) as a starting material. A thin graphene oxide film is prepared by a dip-coating method using a hydrophilic ITO substrate in a water dispersion liquid of the graphene oxide. The graphene oxide is reacted with a hydrated hydrazine vapor at 80° C. for 1 hour in a hydrazine treatment. Then, a negative potential of −1.5 V is applied to the hydrazine-treated graphene oxide in a mixed acetonitrile/water solvent using a supporting electrolyte of tetra-n-butylammonium bromide, a counter carbon electrode, and a reference silver/silver chloride electrode. The resultant is washed with a pure water and dried, and a dispersion liquid of a silver nanowire having an average diameter of 111 nm (manufactured by Seashell Technology) is applied thereto and then dried in an argon flow at 60° C. for 1 hour. The silver nanowire is further coated with an ethyl acetate solution of a polymethyl methacrylate. The resultant is dried under vacuum at the room temperature, the above glass substrate is peeled and removed in water, and the residue is dried to obtain a transparent conductive film.

The obtained carbon electrode has a slightly high work function of 4.3 ±0.1 eV measured by a UPS and is yet usable as a negative electrode.

Example 8

An organic EL device is produced as a photoelectric conversion device. A 50-nm-thick film of a complex of poly(3,4-ethylenedioxythiophene)/poly(styrenesulfonic acid) (PEDOT/PSS) is applied as a hole injection layer by a spin coating method onto an ITO electrode formed on a PET film. A p-type organic semiconductor of N,N'-di-1-naphthyl-N,N'-diphenyl-1,1'-biphenyl-4,4'-diamine (NPD) is vapor-deposited into a thickness of 30 nm on the hole injection layer, tris(8-hydroxyquinoline) aluminum (Alq3) capable of acting as an n-type semiconductor for transferring electrons and of emitting a light is further vapor-deposited into a thickness of 40 nm thereon, and LiF is further vapor-deposited into a thickness of 1.5 nm as an electron injection layer thereon. Then, the transparent carbon electrode produced in Example 5 is laminate-pressed onto the electron injection layer under a reduced pressure at 80° C. to obtain the organic EL device. The edges of the layers are sealed by an epoxy resin.

Furthermore, a roughened surface film is attached to either electrode to improve the light output efficiency.

Thus-obtained organic EL device is transparent, is capable of both-side light emission, has a highlight emission efficiency, and is lightweight and flexible.

Example 9

An organic thin-film solar cell device is produced as a photoelectric conversion device. A 50-nm-thick film of a complex of poly(3,4-ethylenedioxythiophene)/poly(styrene-sulfonic acid) (PEDOT/PSS) is applied as a hole injection layer by a spin coating method onto an ITO glass substrate. A solution of a mixture of an n-type semiconductor of (6,6')-phenyl-C61-butyric acid methyl ester (PCBM) and a p-type polymer semiconductor of poly(3-hexylthiophene) (P3HT) are applied thereto by a spin coating method to form a photoelectric conversion layer having a thickness of 120 nm. A 10-nm-thick thin film of fine $TiO_2$ particles is applied as a hole blocking layer thereon.

Then, the transparent carbon electrode produced in Example 5 is laminate-pressed onto the hole blocking layer under a reduced pressure at 80° C. to obtain the solar cell device. The edges of the layers are sealed by an epoxy resin. Thus-obtained solar cell device is transparent and exhibits a power generation efficiency of 3.0% or more at the room temperature under a simulated AM1.5 solar light irradiation through the carbon electrode.

Example 10

A light emitting device using a field electron emission source is produced as a photoelectric conversion device. A graphene oxide is synthesized in accordance with a literature (W. S. Hummers, et al., J. Am. Chem. Soc., 1958, vol. 80, page 149) using a graphite having an average particle diameter of approximately 4 μm (manufactured by Ito Graphite Co., Ltd.) as a starting material. An ammonia-containing water dispersion liquid of the graphene oxide is printed into a pattern on a silver electrode by a screen printing method, and then is dried. The graphene oxide is reacted with a hydrated hydrazine vapor at 80° C. for 1 hour in a hydrazine treatment. A negative potential of −1.6 V is applied to the hydrazine-treated graphene oxide in a mixed acetonitrile/water solvent using a supporting electrolyte of tetra-n-butylphosphonium bromide, a counter silver electrode, and a reference silver/silver chloride electrode. The resultant is washed with a pure water and dried to obtain a carbon electrode.

As shown in FIG. 7, a stainless steel plate having pores corresponding to the pattern of the carbon electrode is placed as a gate electrode on the carbon electrode with a spacer disposed therebetween. A fluorescent substance-coated ITO glass substrate is placed on the gate electrode and the carbon electrode with a space in-between, and the space is vacuumized and sealed. Thus-obtained field electron emission-type light emitting device has a low threshold voltage and can emit a light uniformly.

Example 11

An X-ray generating device using a field electron emission source is produced as a photoelectric conversion device. A graphene oxide is synthesized in accordance with a literature (W. S. Hummers, et al., J. Am. Chem. Soc., 1958, vol. 80, page 149) using a graphite having an average particle diameter of approximately 4 μm (manufactured by Ito Graphite Co., Ltd.) as a starting material. An ammonia-containing water dispersion liquid of the graphene oxide is applied to a titanium electrode disposed on a mount, and then is dried. The graphene oxide is reacted with a hydrated hydrazine vapor at 80° C. for 1 hour in a hydrazine treatment. A negative potential of −1.6 V is applied to the hydrazine-treated graphene oxide in a mixed acetonitrile/water solvent using a supporting electrolyte of tetra-n-butylphosphonium bromide and a reference silver/silver chloride electrode. The resultant is washed with a pure water and dried to obtain a carbon electrode.

As shown in FIG. 8, the negative electrode of the obtained carbon electrode is placed, together with a mount and a positive molybdenum electrode disposed thereon, in a vessel having an X-ray outlet window, and the vessel is vacuumized and sealed. Thus-obtained field electron emission-type X-ray generating device has a low threshold voltage and a long lifetime.

Example 12

A compound thin-film solar cell is produced as a photoelectric conversion device. Molybdenum is vapor-deposited on a stainless steel (SUS304) foil. A photoelectric conversion layer of a Cu—Ga film, an In film, a p-type selenide CIGS film, an n-type layer of a CdS film, and a ZnO film are formed in this order thereon.

Then, the transparent carbon electrode produced in Example 5 is laminate-pressed onto the ZnO film under a reduced pressure at 80° C. to obtain the compound thin-film solar cell device. The edges of the layers are sealed by an epoxy resin.

The solar cell of the embodiment has a high energy conversion efficiency, can be relatively easily prevented from being deteriorated in the output by using only a simple sealant without water removing agents and oxygen removing agents, and is lightweight and flexible.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A carbon electrode comprising a graphene having a graphene skeleton, carbon atoms in the graphene skeleton being partially substituted by a nitrogen atom,
wherein
the graphene contains an oxygen atom,
the carbon electrode is doped with a cation the graphene is obtained by electrochemically reducing a hydrazine treated graphene oxide,
the graphene skeleton is doped with electrons as a counter charge for the cation, and
the carbon electrode has a peak of a nitrogen 1s signal at 402.0±0.4 eV or a peak of a phosphorus 2p signal at 132.5 ±0.4 in an X-ray photoelectron spectrum.

2. The carbon electrode according to claim 1, wherein the ratio of the oxygen atom: the carbon atoms is 1:20 to 1:8.3.

3. The carbon electrode according to claim 1, wherein the cation is a quaternary ammonium ion or a quaternary phosphonium ion.

4. The carbon electrode according to claim 1, wherein the carbon electrode is stacked on a metal nanowire.

5. A photoelectric conversion device comprising a carbon electrode as a negative electrode,
wherein
the carbon electrode contains a graphene having a graphene skeleton, carbon atoms in the graphene skeleton being partially substituted by a nitrogen atom,
the graphene contains an oxygen atom,
the carbon electrode is doped with a cation the graphene is obtained by electrochemically reducing a hydrazine treated graphene oxide,
the graphene skeleton is doped with electrons as a counter charge for the cation, and
the carbon electrode has a peak of a nitrogen 1s signal at 402.0 ±0.4 eV or a peak of a phosphorus 2p signal at 132.5 ±0.4 in an X-ray photoelectron spectrum.

6. The photoelectric conversion device according to claim 5, wherein the ratio of the oxygen atom: the carbon atoms is 1:20 to 1:8.3.

7. The photoelectric conversion device according to claim 5, wherein the cation is a quaternary ammonium ion or a quaternary phosphonium ion.

8. The photoelectric conversion device according to claim 5, wherein the carbon electrode is stacked on a metal nanowire.

9. The carbon electrode according to claim 1, wherein when the graphene is electrochemically reduced an agent including a quaternary ammonium ion or a quaternary phosphonium ion is used, and
the cation is the quaternary ammonium ion or the quaternary phosphonium ion of the agent.

10. The photoelectric conversion device according to claim 5, wherein when the graphene is electrochemically reduced an agent including a quaternary ammonium ion or a quaternary phosphonium ion is used, and
the cation is the quaternary ammonium ion or the quaternary phosphonium ion of the agent.

11. The carbon electrode according to claim 1, wherein the nitrogen substituted graphene oxide whose skeleton is partially substituted by the nitrogen atom is obtained by the hydrazine treatment of the graphene oxide.

12. The photoelectric conversion device according to claim 5, wherein the nitrogen substituted graphene oxide whose skeleton is partially substituted by the nitrogen atom is obtained by the hydrazine treatment of the graphene oxide.

13. The carbon electrode according to claim 1, wherein the cation is as a result of the electrochemical reduction in the presence of a quaternary ammonium ion or a quaternary phosphonium ion.

14. The photoelectric conversion device according to claim 5, wherein the cation is as a result of the electrochemical reduction in the presence of a quaternary ammonium ion or a quaternary phosphonium ion.

15. The carbon electrode according to claim 1, the cation is a quaternary ammonium ion or a quaternary phosphonium ion,
the peak of the nitrogen 1s signal at 402.0 ±0.4 eV in the X-ray photoelectron spectrum corresponds to a nitrogen atom in the quaternary ammonium ion, or
the peak of the phosphorus 2p signal at 132.5 ±0.4 in the X-ray photoelectron spectrum corresponds to a phosphorous atom in the quaternary phosphonium ion.

16. The photoelectric conversion device according to claim 5, the cation is a quaternary ammonium ion or a quaternary phosphonium ion,
the peak of the nitrogen 1s signal at 402.0 ±0.4 eV in the X-ray photoelectron spectrum corresponds to a nitrogen atom in the quaternary ammonium ion, or
the peak of the phosphorus 2p signal at 132.5 ±0.4 in the X-ray photoelectron spectrum corresponds to a phosphorous atom in the quaternary phosphonium ion.

* * * * *